US010879933B2

(12) United States Patent
Kim et al.

(10) Patent No.: US 10,879,933 B2
(45) Date of Patent: Dec. 29, 2020

(54) REED SOLOMON DECODER AND SEMICONDUCTOR DEVICE INCLUDING THE SAME

(71) Applicants: SK hynix Inc., Icheon (KR); Korea Advanced Institute of Science and Technology (KAIST), Daejeon (KR)

(72) Inventors: Hyunho Kim, Daejeon (KR); Incheol Park, Daejeon (KR); Wooyoung Kim, Seoul (KR); Youngook Song, Seoul (KR); Sanggu Jo, Bucheon (KR)

(73) Assignees: SK hynix Inc., Icheon (KR); Korea Advanced Institute of Science and Technology, Daejeon (KR)

( * ) Notice: Subject to any disclaimer, the term of this patent is extended or adjusted under 35 U.S.C. 154(b) by 57 days.

(21) Appl. No.: 16/239,460

(22) Filed: Jan. 3, 2019

(65) Prior Publication Data
US 2019/0319643 A1 Oct. 17, 2019

(30) Foreign Application Priority Data

Apr. 16, 2018 (KR) .................. 10-2018-0043797
Dec. 21, 2018 (KR) .................. 10-2018-0167946

(51) Int. Cl.
*H03M 13/00* (2006.01)
*H03M 13/15* (2006.01)

(52) U.S. Cl.
CPC ..... *H03M 13/1515* (2013.01); *H03M 13/154* (2013.01); *H03M 13/1545* (2013.01); *H03M 13/1555* (2013.01)

(58) Field of Classification Search
None
See application file for complete search history.

(56) References Cited

U.S. PATENT DOCUMENTS 5,428,628 A * 6/1995 Hassner .............. H03M 13/151
714/759
7,870,468 B1 * 1/2011 Vanka ............... H03M 13/1515
714/784

(Continued)

FOREIGN PATENT DOCUMENTS

KR 20040045922 6/2004

OTHER PUBLICATIONS

M. Zhang, Z. Dai, X. Gao, Y. Huang and F. Gu, "The Design and Implementation of Reed-Solomon Decoder in Broadband Wireless Access," 2008 4th International Conference on Wireless Communications, Networking and Mobile Computing, Dalian, 2008, pp. 1-4 , doi: 10.1109/WiCom.2008.343. (Year: 2008).*

(Continued)

*Primary Examiner* — Daniel F. McMahon (57) ABSTRACT

A Reed Solomon decoder may include a syndrome calculation (SC) circuit, a key equation solver (KES) circuit, and a Chien search and error evaluation (CSEE) circuit. The SC circuit calculates a syndrome from a codeword. The KES circuit includes a plurality of sub-KES circuit and calculates an error location polynomial and an error evaluation polynomial from the syndrome. The CSEE circuit calculates an error location and an error value from the error location polynomial and the error evaluation polynomial. Each of the plurality of sub-KES circuits, the SC circuit and the CSEE circuit respectively constitute pipeline stages. The Read Solomon decoder may also include a FIFO queue that queues the codeword among a plurality of codewords sequentially received, and an error correction circuit that produces error corrected data using an output from the FIFO queue, the error location, and the error value.

18 Claims, 11 Drawing Sheets

(56) References Cited

U.S. PATENT DOCUMENTS

| | | | |
|---|---|---|---|
| 8,365,054 B2 | 1/2013 | Gasanov et al. | |
| 2001/0014960 A1* | 8/2001 | Ohyama | H03M 13/2909 714/755 |
| 2006/0174181 A1* | 8/2006 | Banks | H03M 13/15 714/784 |
| 2009/0254796 A1* | 10/2009 | Hassner | H03M 13/154 714/780 |
| 2017/0093433 A1* | 3/2017 | Ilani | H03M 13/159 |

OTHER PUBLICATIONS

Chang, et al., "A Reed-Solomon Product-Code (RS-PC) Decoder for DVD Applications," IEEE International Solid-State Circuits Conference, 1998, vol. 36 (2), pp. 390-391, 470.

DailyTech—Coalition of 20+ Tech Firms Backs MRAM as Potential DRAM, NAND Replacement, 2018, http://www.dailytech.com/Coalition+of+20+Tech+Firms+Backs+MRAM+as+Potential+DRAM+NAND+Replacement/article33826.htm, pp. 14.

Compact Disc Interactive Full Functional Specification, Philips Consumer Electroncis B.V., 1994, Chapter 11, pp. 28-37.

Kim, et al., "Low-latency Reed-Solomon Encoder and Decoder Using Pipelining and Parallel Technique," Department of Electrical Engineering, Published as a poster paper in the 24th Korean Conference on Semiconductor ("WP1-201.pdf" included in a compressed file located at http://kcs.cosar.or.kr/data_download/KCS_2017.zip ).

Moon, "Error Correction Coding: Mathematical Methods and Algorithms," John Wiley & Sons, Inc., 2005, pp. 253-265.

Nair, et al., "Citadel: Efficiently Protecting Stacked Memory from Large Granularity Failures," 47th Annual IEEE/ACM International Symposium on Microarchitecture, 2014, pp. 51-62.

Parhi, "VLSI Digital Signal Processing Systems: Design and Implementation," John Wiley & Sons, Inc., 1999, pp. 119-124.

Sarwate, et al., "High-speed Architectures for Reed-Solomon Decoders," IEEE Transactions on Very Large Scale Integration (VLSI) Systems, 2001, vol. 9 (5), pp. 641-655.

Yang, et al., "Product Code Schemes for Error Correction in MLC NAND Flash Memories," IEEE Transactions on Very Large Scale Integration (VLSI) Systems, 2012, vol. 20 (12), pp. 2302-2314.

* cited by examiner

Algorithm 1 The 2-stage Unfolded RBM Algorithm

1: Initialization:
2: $\delta_{3t}(0) = \theta_{3t}(0) = 1, \delta_i(0) = \theta_i(0) = 0, (i = 2t, 2t+1, \cdots, 3t-1), k(0) = 0, \gamma(0) = 1.$
3: Input: $s_i, (i = 0, 1, \cdots, 2t-1)$
4: $\delta_i(0) = \theta_i(0) = s_i, (i = 0, 1, \cdots, 2t-1)$
5: for $\tau = 0, 1, \cdots, t-1$ do
6:    begin
7:    $\delta_i'(\tau) = \gamma(\tau) \cdot \delta_{i+1}(\tau) - \delta_0(\tau) \cdot \theta_i(\tau), (i = 0, 1, \cdots, 3t)$
8:    if $\delta_0(\tau) \neq 0$ and $k(\tau) \geq 0$ then
9:      begin
10:      $\theta_i'(\tau) = \delta_{i+1}(\tau), (i = 0, 1, \cdots, 3t)$
11:      $\gamma'(\tau) = \delta_0(\tau)$
12:      $k'(\tau) = -k(\tau) - 1$
13:      end
14:    else
15:      begin
16:      $\theta_i'(\tau) = \theta_i(\tau), (i = 0, 1, \cdots, 3t)$
17:      $\gamma'(\tau) = \gamma(\tau)$
18:      $k'(\tau) = k(\tau) + 1$
19:      end
20:    end if
21:    begin
22:    $\delta_i(\tau+1) = \gamma'(\tau) \cdot \delta_i'(\tau) - \delta_0'(\tau) \cdot \theta_i'(\tau), (i = 0, 1, \cdots, 3t)$
23:    if $\delta_0'(\tau) \neq 0$ and $k'(\tau) \geq 0$ then
24:      begin
25:      $\theta_i(\tau+1) = \delta_{i+1}'(\tau), (i = 0, 1, \cdots, 3t)$
26:      $\gamma(\tau+1) = \delta_0'(\tau)$
27:      $k(\tau+1) = -k'(\tau) - 1$
28:      end
29:    else
30:      begin
31:      $\theta_i(\tau+1) = \theta_i'(\tau), (i = 0, 1, \cdots, 3t)$
32:      $\gamma(\tau+1) = \gamma'(\tau)$
33:      $k(\tau+1) = k'(\tau) + 1$
34:      end
35:    end if
36: end for
37: Output: $\lambda_i(t) = \delta_{2t}(t), (i = 0, 1, \cdots, t), \Omega_i(t) = \delta_i(t), (i = 0, 1, \cdots, t-1)$

REED SOLOMON DECODER AND SEMICONDUCTOR DEVICE INCLUDING THE SAME

CROSS-REFERENCE TO RELATED APPLICATIONS

The present application claims priority under 35 U.S.C. § 119(a) to Korean Patent Application No. 10-2018-0043797, filed on Apr. 16, 2018, and Korean Patent Application No. 10-2018-0167946, filed on Dec. 21, 2018, which are incorporated herein by reference in their entireties.

BACKGROUND

1. Technical Field

Various embodiments may generally relate to a Reed Solomon decoder and a semiconductor device including the Reed Solomon decoder.

2. Related Art

Figure 1:
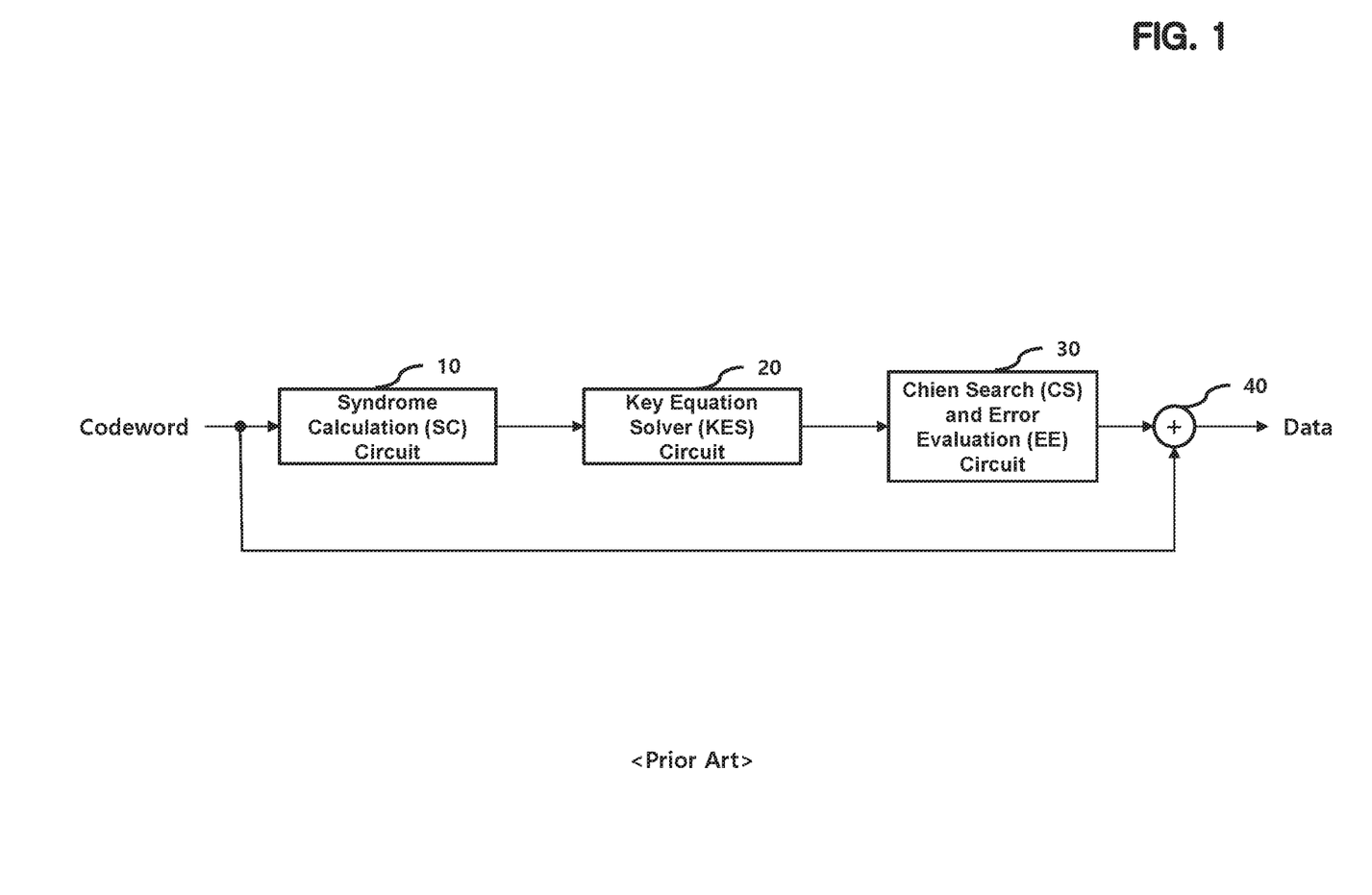
FIG. 1 shows a block diagram illustrating a conventional Reed Solomon decoder.

FIG. 1 is a block diagram illustrating a conventional Reed Solomon decoder.

The conventional Reed Solomon decoder includes a syndrome calculation (SC) circuit 10 for calculating a syndrome from a codeword, a key equation solver (KES) circuit 20 for solving a key equation using a syndrome, and a Chien search and error evaluation (CEEE) circuit 30 for performing a Chien search operation and an error evaluation operation using the output of the KES circuit 20 and an error correction circuit 40 for providing an error corrected output data.

Figure 2:
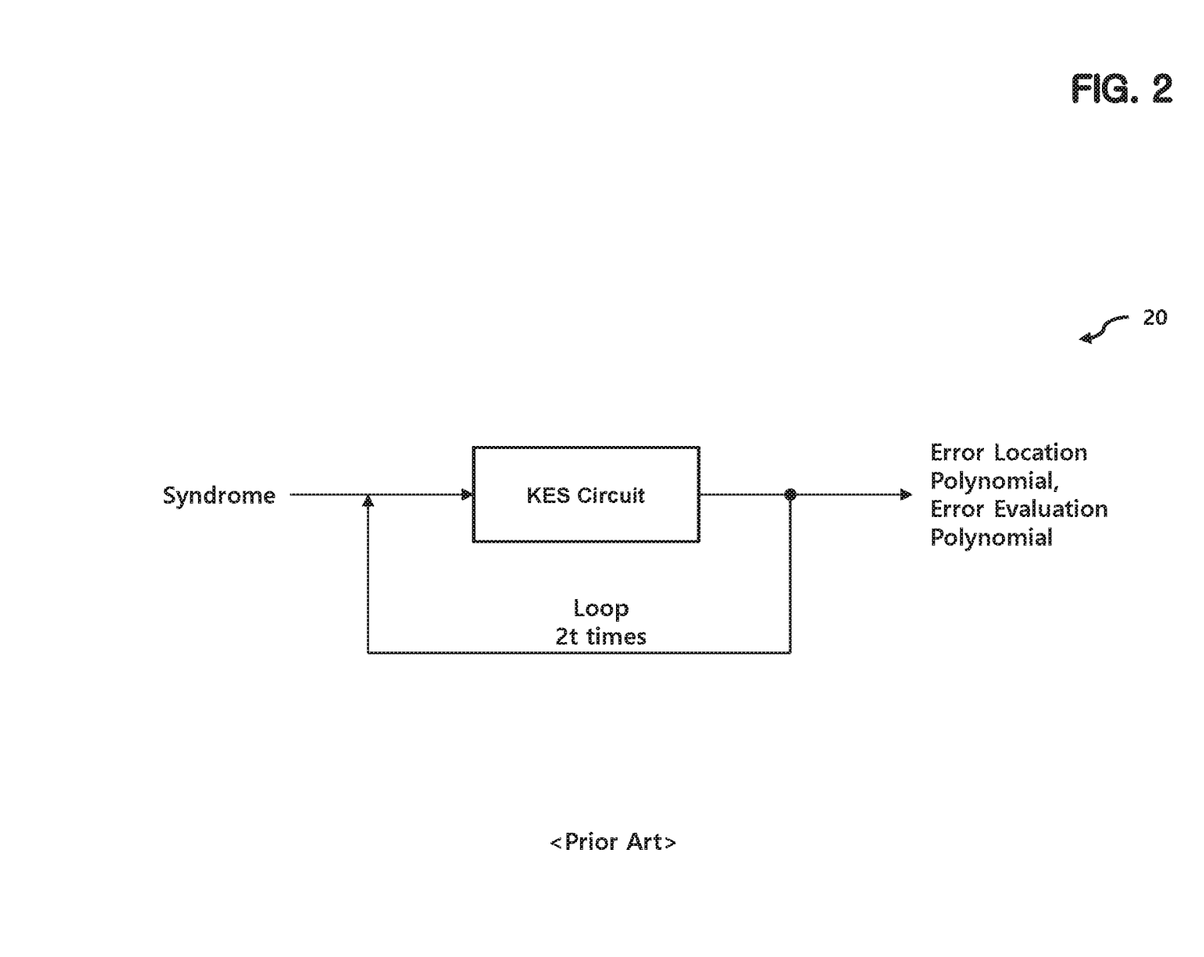
FIG. 2 shows a block diagram illustrating an operation of the KES circuit of FIG. 1.

FIG. 2 is a block diagram illustrating an operation of the KES circuit 20 of FIG. 1.

The conventional KES circuit 20 outputs an error location polynomial and an error evaluation polynomial from the syndrome. To do this, the calculation is performed while looping 2t times, where 2t corresponds to the number of parity symbol included in the codeword. For example, for a block encoded using Reed Solomon coding having 255 symbols, of which 223 are data symbols and 32 are parity symbols, 2t=32.

For example, if one clock is required for the operation of the SC circuit 10, two clocks for the operation of the CSEE circuit 30, and one clock for the KES circuit 20 to loop once, the latency becomes 2t+3.

Also, the conventional Reed Solomon decoder cannot start a decoding operation for a new codeword during a decoding operation for a previously inputted codeword.

Accordingly, there is a problem that the conventional Reed Solomon decoder has a long latency and low throughput and thus cannot perform a high speed decoding.

SUMMARY

In accordance with the present teachings, a Reed Solomon decoder may include a syndrome calculation (SC) circuit configured to calculate a syndrome from a codeword; a key equation solver (KES) circuit configured to calculate an error location polynomial and an error evaluation polynomial from the syndrome; and a Chien search and error evaluation (CSEE) circuit configured to calculate an error location and an error value from the error location polynomial and the error evaluation polynomial, wherein the KES circuit comprises a plurality of sub-KES circuits and each of the plurality of sub-KES circuits, the SC circuit and the CSEE circuit constitutes pipeline stages respectively.

In accordance with the present teachings, a semiconductor device may include an error correction encoder configured to output a codeword by encoding data; a memory cell array configured to store the codeword output from the error correction encoder; and an error correction decoder configured to output error corrected data by decoding a codeword output from the memory cell.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined in accordance with the presented claims and equivalents thereof.

Figure 3:
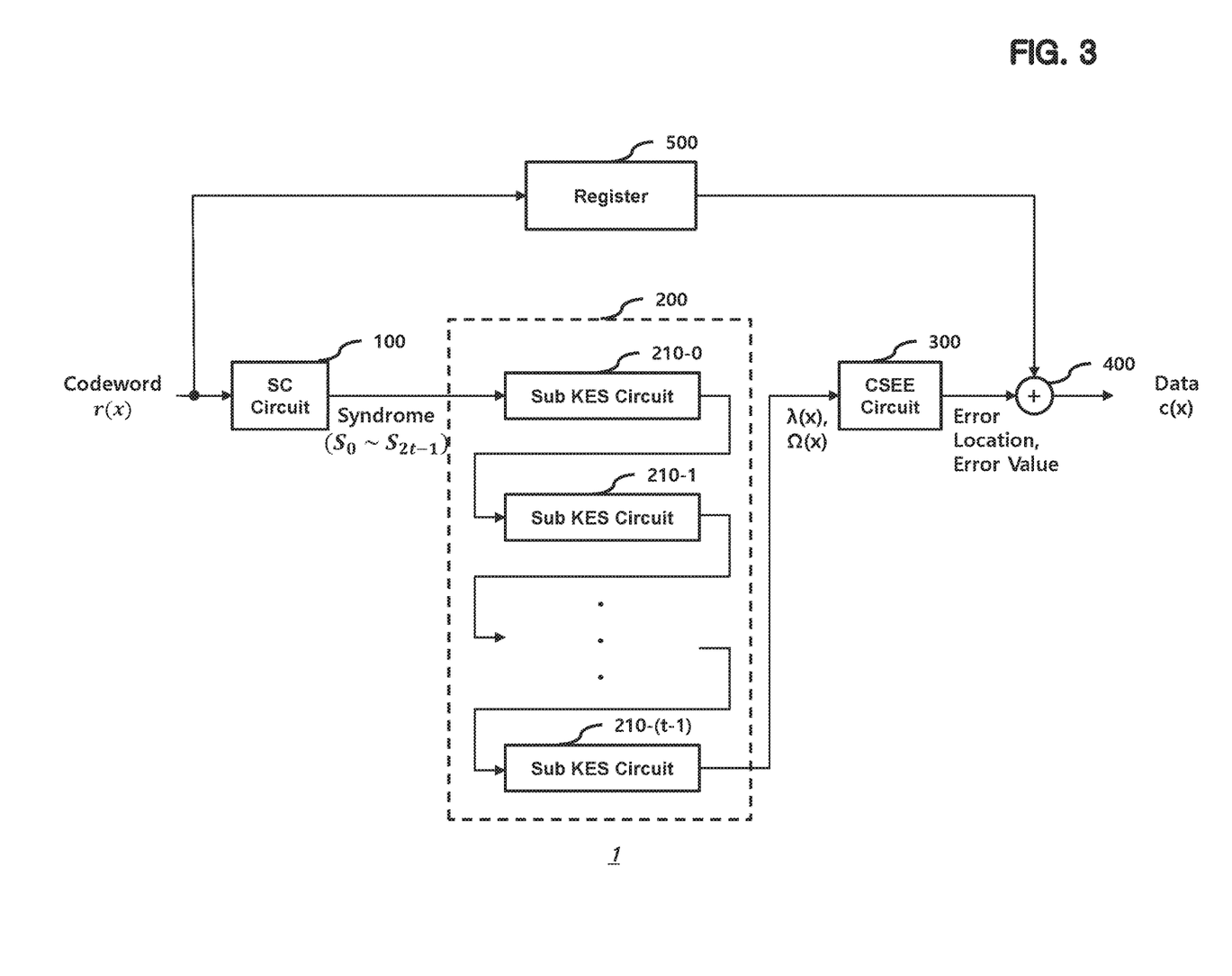
FIG. 3 shows a block diagram illustrating a Reed Solomon decoder according to an embodiment of the present disclosure.

FIG. 3 is a block diagram illustrating a Reed Solomon decoder 1 according to an embodiment of the present disclosure.

The Reed Solomon decoder 1 includes a syndrome calculation (SC) circuit 100, a key equation solver (KES) circuit 200, and a Chien search and error evaluation (CSEE) circuit 300.

The Reed Solomon decoder 1 may further include a register 500 for sequentially queuing input codewords and an error correction circuit 400 to output error corrected data produced using a codeword output from the register 500 and an error location and an error value output from the CSEE circuit 300.

The SC circuit 100 outputs a syndrome including syndrome elements $S_0$ to $S_{2t-1}$ produced using the codeword r(x).

Hereinafter, the codeword may be represented by a codeword polynomial, and the syndrome may be represented by a syndrome polynomial.

The KES circuit 200 outputs an error location polynomial λ(x) and an error evaluation polynomial Ω(x), each produced using the syndrome.

CSEE circuit 300 receives the error location polynomial λ(x) and the error evaluation polynomial Ω(x) and outputs an error location and an error value each produced using the received polynomials.

In this embodiment, the basic operation principle of the SC circuit 100, the KES circuit 200 and the CSEE circuit 300 is similar to that of the conventional Reed Solomon decoder of FIG. 1.

For example, the CSEE circuit 300 may be configured to perform a Chien Search algorithm and a Forney algorithm.

Since these algorithms are well known, a detailed description thereof will be omitted.

The SC circuit 100 and the CSEE circuit 300 may have a parallel structure in order to increase the processing speed.

In an embodiment, the KES circuit 200 includes a plurality of sub-KES circuits 210-0 to 210-($t$–1) connected in series.

In an embodiment, the KES circuit 200 includes t sub-KES circuits 210-0, 210-1, . . . , 210-($t$–1) (where t is a natural number). In an embodiment, t is equal to half the number of parity symbols included in the codeword r(x).

The t sub-KES circuits 210-0 to 210-($t$–1) replace the conventional KES circuit 20 which performs the operation by looping 2t times.

At this time, each of the sub-KES circuits 210-0 to 210-($t$–1), the SC circuit 100, and the CSEE circuit 300 may respectively constitute a pipeline stage.

For example, if in an embodiment each pipeline stage requires two clock cycles to perform its respective operation, the overall latency may be t+4 clock cycles.

Also, since the Reed Solomon decoder 1 according to an embodiment of the present invention operates in a pipelined manner, a decoding operation for a new codeword can be performed while a decoding operation for a previously input codeword is performed, thereby a throughput may be increased. For example, in the embodiment wherein each pipeline stage requires two clock cycles to perform its respective operation, a new codeword can be decoded every 2 clock cycles.

The register 500 sequentially queues codewords and provides a codeword corresponding to an error location and an error value output from the CSEE circuit 300 to the error correction circuit 400. In an embodiment, the register 500 is configured to queue a number of codewords corresponding to the total number of pipe stages in the SC circuit 100, the KES circuit 200, and the CSEE circuit 300, and to operate as a first-in, first-out (FIFO) queue.

The error correction circuit 400 modifies the codeword from the register 500 according to the error location and the error value to produce and output an error corrected data.

Figure 4:
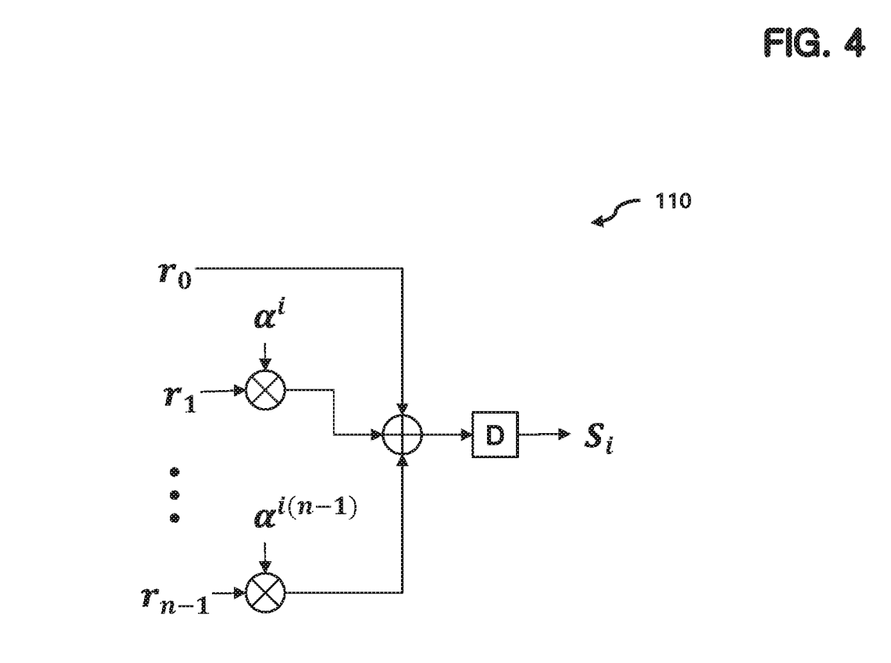
FIG. 4 shows a block diagram illustrating a SC circuit according to an embodiment of the present disclosure.

FIG. 4 is a detailed block diagram illustrating a sub-SC circuit 110 included in the SC circuit 100 of FIG. 3.

The sub-SC circuit 110 outputs a syndrome element $S_i$ and the SC circuit 100 includes a plurality of sub-SC circuit 110 arranged in parallel to output a plurality of syndrome elements $S_i$ (i=0, . . . , 2t–1) at the same time, wherein 2t corresponds to a number of parity symbols in the codeword r(x).

Hereinafter, a codeword polynomial is represented by r(x), an error corrected data polynomial is represented by c(x), and an error polynomial is expressed by e(x).

The codeword polynomial r(x) can be expressed as:

$$r(x)=c(x)+e(x)$$

If a message polynomial is m(x) and a codeword generating polynomial is g(x), the codeword polynomial can be expressed as:

$$g(x)=(x-\alpha^0) \ldots (x-\alpha^{2t-1})$$

$$c(x)=m(x)g(x)$$

In the above, $\alpha^i$ (i=0, . . . , 2t–1) is a root of the primitive polynomial constituting a Galois field.

In a syndrome polynomial, each syndrome element $S_i$ is expressed as:

$$S_i=r(\alpha^i)=c(\alpha^i)+e(\alpha^i)=e(\alpha^i), i=0, \ldots 2t-1$$

Figure 5:
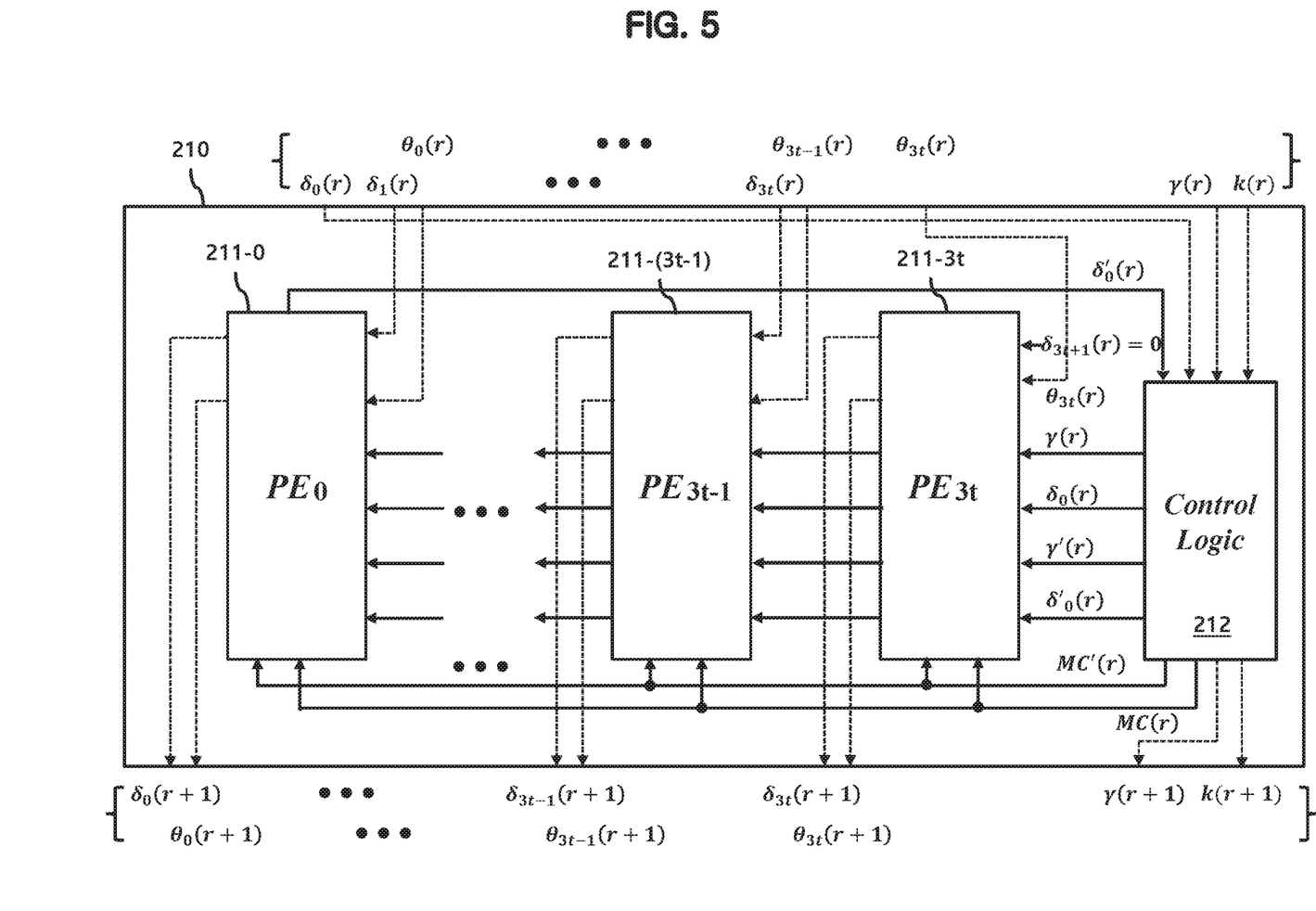
FIG. 5 shows a block diagram illustrating a sub-KES circuit according to an embodiment of the present disclosure.

FIG. 5 is a detailed block diagram illustrating a sub-KES circuit 210 of FIG. 3. The sub-KES circuit 210 includes 3t+1 Processing Element (PE) circuits 211-0, . . . , 211-(3t–1), 211-3t and a control circuit 212 for controlling the circuit. The sub-KES circuit 210 of FIG. 5 corresponds to the $r^{th}$ sub-KES circuit 210-$r$ of FIG. 3 (for each r=0, 1, . . . , t–1).

The $r^{th}$ sub-KES circuit 210 receives inputs such as $\theta_i(r)$, $\delta_i(r)$, γ(r) and k(r) from a previous sub-KES circuit (i=0, 1, . . . , 3t). For example, $\theta_i(r)$ are input to $i^{th}$ PE circuit 211-$i$ (i=0, 1, . . . ,3t), $\delta_{i+1}(r)$ are input to $i^{th}$ PE circuit 211-$i$ (i=0, 1, . . . , 3t–1) and $3t^{th}$ PE circuit 211-3t receives a fixed value 0 instead of $\delta_{3t+1}(r)$. $\delta_0(r)$, γ(r) and k(r) are input to a control logic 212.

For the $0^{th}$ sub-KES circuit 210-0, the inputs $\theta_i(0)$ and $\delta_i(0)$ are initialized to $S_i$ (i=0, 1, . . . , 2t–1), the inputs $\theta_i(0)$ and $\delta_i(0)$ are initialized to 0 (i=2t, 2t+1, . . . , 3t–2, 3t–1), the inputs $\theta_{3t}(0)$ and $\delta_{3t}(0)$ are initialized to 1, k(0) is initialized to 0 and the input γ(0) is initialized to 1.

The $r^{th}$ sub-KES circuit 210 provides outputs such as $\theta_i(r+1)$, $\delta_i(r+1)$, γ(r+1) and k(r+1) to a next sub-KES circuit, where $\theta_i(r+1)$ and $\theta_i(r+1)$ are output from $i^{th}$ PE circuit 211-$i$ and γ(r+1) and k(r+1) are output from a control logic 212 (i=0, 1, . . . , 3t).

The $(t-1)^{th}$ sub-KES circuit 210-($t$–1) provides coefficients $\lambda_i(t)$ of an error location polynomial λ(x) and coefficients $\Omega_i(t)$ of an error evaluation polynomial Ω(x), where $\lambda_i(t)=\delta_{i+1}(t)$ and $\Omega_i(t)=\delta_i(t)$ (i=0, 1, . . . , t–1).

Operation of the PE circuits 211-0 to 211-3t is described below.

Figure 6:
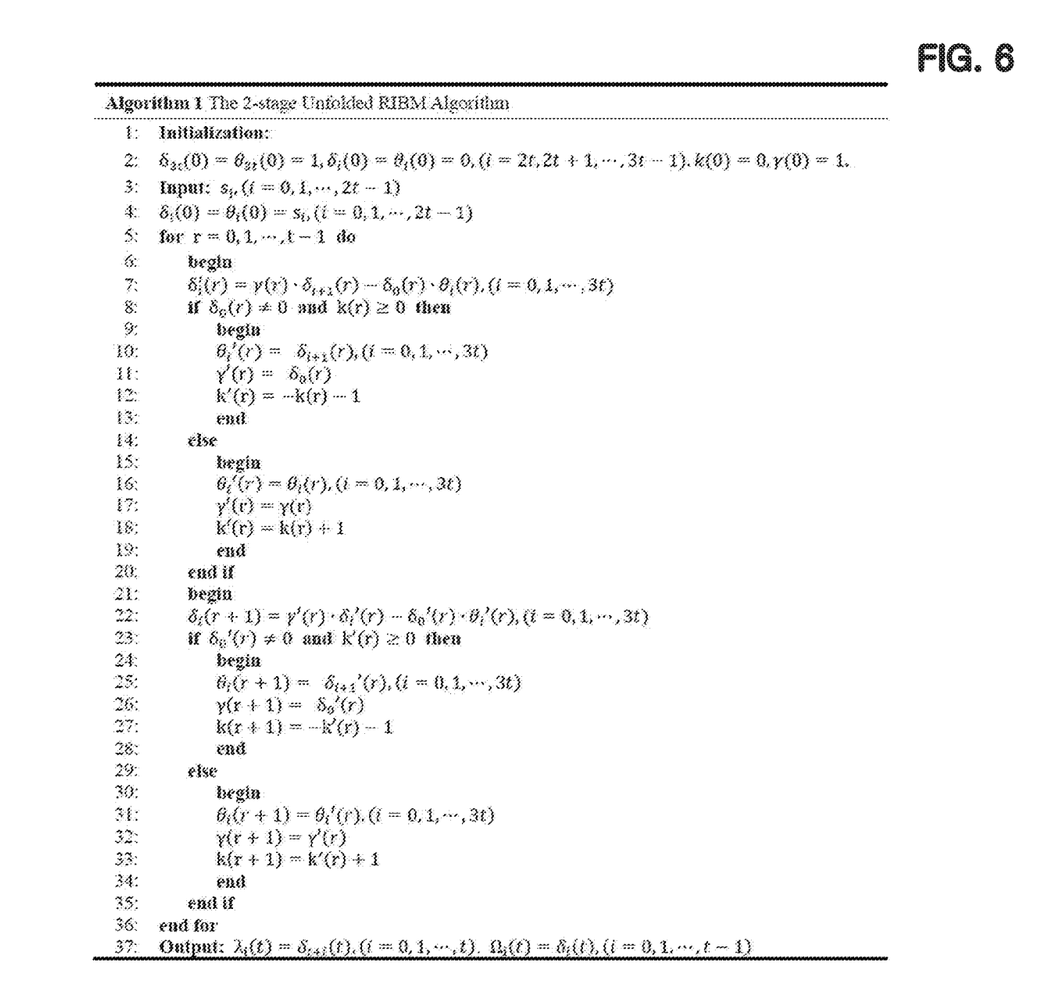
FIG. 6 shows an algorithm illustrating an operation of a sub-KES circuit according to an embodiment of the present disclosure.

FIG. 6 illustrates an algorithm showing an operation of the KES circuit 200 of FIG. 3.

In an embodiment of the invention, the KES circuit 200 performs a 2-stage unfolded RiBM algorithm disclosed in FIG. 6.

This embodiment includes t sub-KES circuits 210-0 to 210-($t$–1) in the KES circuit 200. Each sub-KES circuit 210-$r$ ($r=0, 1, \ldots, t-1$) performs operations corresponding to lines 6 to 35 of the algorithm of FIG. 6.

Since the sub-KES circuits 210-0 to 210-($t-1$) are connected in series, the $r^{th}$ sub-KES circuit 210-$r$ performs an operation corresponding to the r value iterated on line 5 of the algorithm of FIG. 6 ($r=0, 1, \ldots, t-1$). That is, each of the sub-KES circuits 210-0 to 210-($t-1$) performs one respective cycle of the do-loop beginning on line 5 using a respective value of r.

The control circuit 212 controls each of the 3t+1 PE circuits 211-0 to 211-3t to perform a first operation and a second operation. The first operation corresponds to lines 7 to 20 of the algorithm of FIG. 6 and the second operation corresponds to lines 21 to 35 of FIG. 6. The control circuit 212 indicates the determination result computed at line 8 of FIG. 6 to the PE circuits 211-0 to 211-3t using the signal MC(r), and indicates the determination result computed at line 23 of FIG. 6 using the signal MC'(r).

The control circuit 212 controls each of the 3t+1 PE circuits 211-0 to 211-3t to perform the first operation and then to perform the second operation. The first operation and the second operation are sequentially performed at each of the 3t+1 PE circuits 211-0 to 211-3t.

Figure 7:
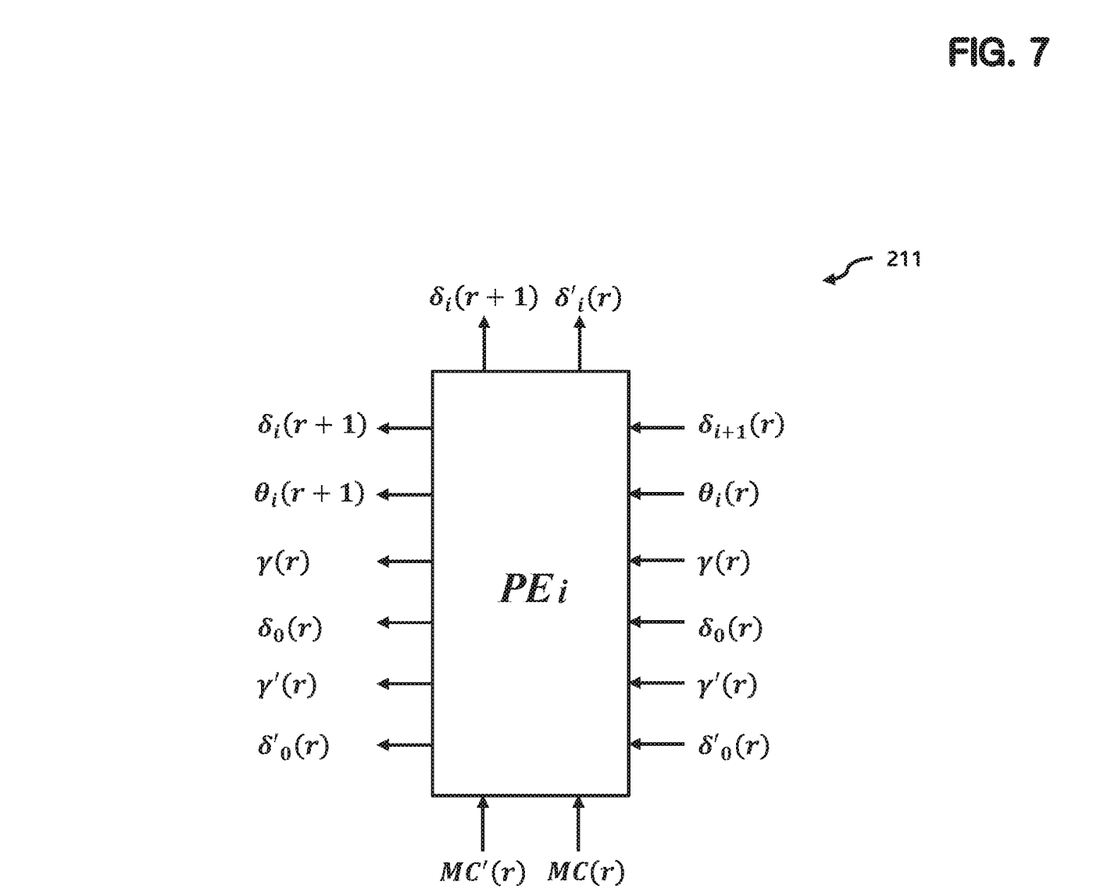
FIG. 7 show a symbol diagram illustrating a PE circuit according to an embodiment of the present disclosure.

FIG. 7 is a symbol diagram illustrating an $i^{th}$ PE circuit 211 of FIG. 5.

The PE circuit 211 includes terminals for inputting and outputting signals necessary for a first operation performed at lines 7, 10 and 16 of the algorithm of FIG. 6 and a second operation performed at lines 22, 25 and 31 of the algorithm of FIG. 6.

For example, the PE circuit 211 receives inputs such as $\delta_{i+1}(r)$, $\theta_i(r)$, $\delta_0(r)$, $\gamma(r)$, $\delta'_0(r)$, $\gamma'(r)$, MC(r) and MC'(r). The PE circuit 211 generates outputs such as $\delta_i(r+1)$, $\theta_i(r+1)$, $\delta_0(r)$, $\gamma(r)$, $\delta'_0(r)$ and $\gamma'(r)$.

Figure 8:
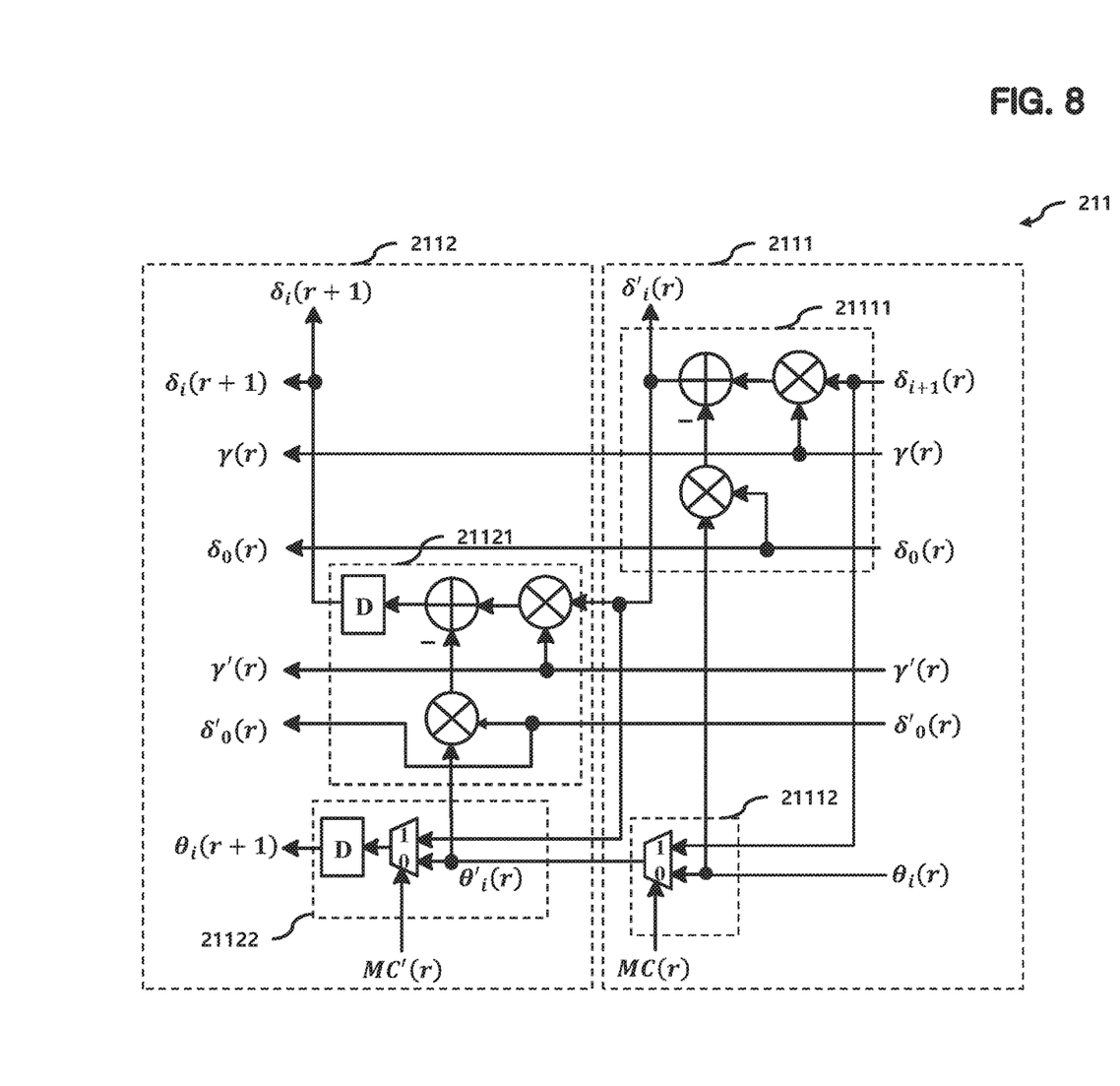
FIG. 8 show a detailed block diagram illustrating a PE circuit according to an embodiment of the present disclosure.

FIG. 8 is a detailed block diagram illustrating a PE circuit 211 of FIG. 7.

The PE circuit 211 includes a first operation circuit 2111 for a first operation and a second operation circuit 2112 for a second operation. The first operation circuit 2111 includes a first operation block 21111 and a second operation block 21112. The second operation circuit 2112 includes a third operation block 21121 and a fourth operation block 21122.

The detailed block diagram disclosed in FIG. 8 represents operations performed by a PE circuit in the algorithm of FIG. 6 with symbols.

For example, the first operation block 21111 performs an operation corresponding to a line 7 of FIG. 6 and the second operation block 21112 performs an operation corresponding to lines 10 or 16 of FIG. 6. Similarly, the third operation block 21121 performs an operation corresponding to a line 22 of FIG. 6 and the fourth operation block 21122 performs an operation corresponding to lines 25 or 31 of FIG. 6. D flipflops are included in the third operation block 21121 and the fourth operation block 21122 for keeping data at a corresponding pipeline stage.

Since each operation block is a direct representation of corresponding operation in the algorithm, a detailed description thereof will be omitted.

Figure 9:
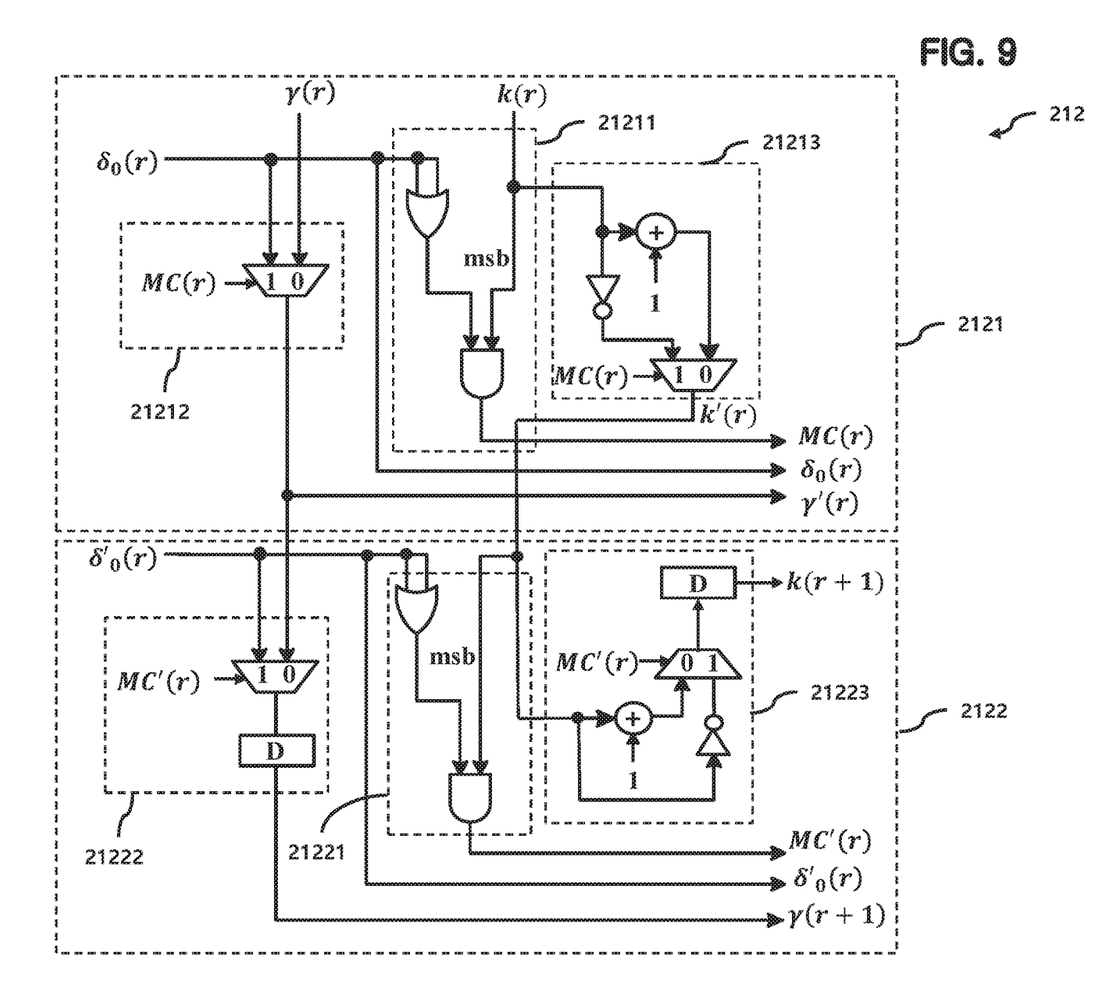
FIG. 9 show a detailed block diagram illustrating a control circuit according to an embodiment of the present disclosure.

FIG. 9 is a detailed block diagram of the control circuit 212 of FIG. 7.

The control circuit 212 performs a first control operation performed at lines 8, 11, 12, 17 and 18 of the algorithm of FIG. 6 and a second control operation performed at lines 23, 26, 27, 32 and 33 of the algorithm of FIG. 6.

The control circuit 212 includes a first control circuit 2121 for a first control operation and a second control circuit 2122 for a second control operation. The first control circuit 2121 includes a first control block 21211, a second control block 21212 and a third control block 21213. The second control circuit 2122 includes a fourth control block 21221, a fifth control block 21222 and a sixth control block 21223. D flipflops are included in the fifth control block 21222 and the sixth control block 21223 for keeping data at a corresponding pipeline stage.

The signal indicating the determination result at line 8 is denoted as MC(r), and the signal indicating the determination result at line 23 is denoted as MC'(r).

Since the circuit of FIG. 9 represents control operations performed by a control circuit in the algorithm of FIG. 6 with symbols.

For example, the first control block 21211 generates a signal MC(r) which corresponds to a signal indicating the determination result of line 8 of FIG. 6, the second control block 21212 performs an operation corresponding to lines 11 or 17 of FIG. 6, and the third control block 21213 performs an operation corresponding to line 12 or 18 of FIG. 6. Similarly, the fourth control block 21221 generates a signal MC'(r) which corresponds to a signal indicating the determination result of line 23 of FIG. 6, the fifth control block 21222 performs an operation corresponding to lines 26 or 32 of FIG. 6, and the sixth control block 21223 performs an operation corresponding to line 27 or 33 of FIG. 6.

The operations of line 12 and 27 are related to 2's complement operation to represent negative value. For example, a negative value of k(r) may correspond to a bitwise inversion of k(r) plus 1. Therefore, the bitwise inversion of k(r) may be represented by the negative value of k(r) minus 1 like the line 12 of FIG. 6.

Since each control block is a direct representation of corresponding operation in the algorithm, a detailed description thereof will be omitted.

Figure 10:
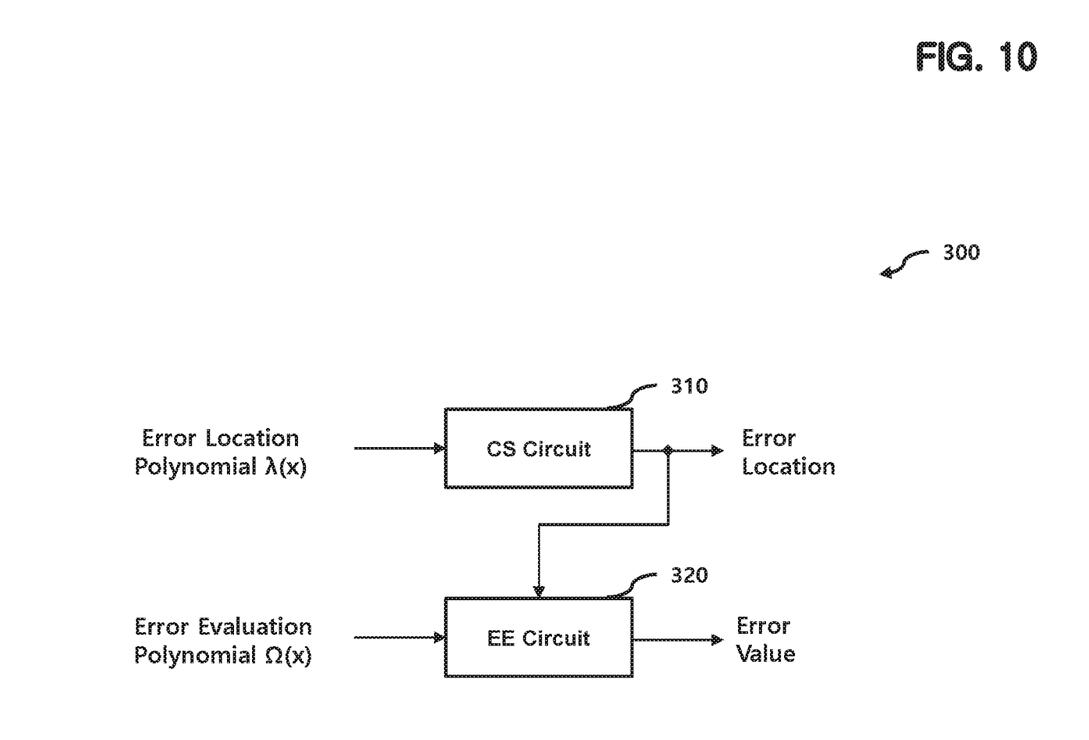
FIG. 10 show a detailed block diagram illustrating a CSEE circuit according to an embodiment of the present disclosure.

FIG. 10 is a detailed block diagram of the CSEE circuit 300 of FIG. 3

The CSEE circuit 300 includes a Chien Search (CS) circuit 310 and an error evaluation (EE) circuit 320.

The CS circuit 310, which is a circuit that implements a Chien search algorithm, receives the error location polynomial $\lambda(x)$ output from the KES circuit 200, and calculates and outputs an error location.

The EE circuit 320, which is a circuit that implements a Forney algorithm, receives the error evaluation polynomial $\Omega(x)$ output from the KES circuit 200 and the error location output from the CS circuit 310, and calculates and outputs an error value.

Various circuits that implement the Chien search algorithm or the Forney algorithm are known.

In order to improve the operation speed, it is preferable to implement a circuit in a parallel manner.

Figure 11:
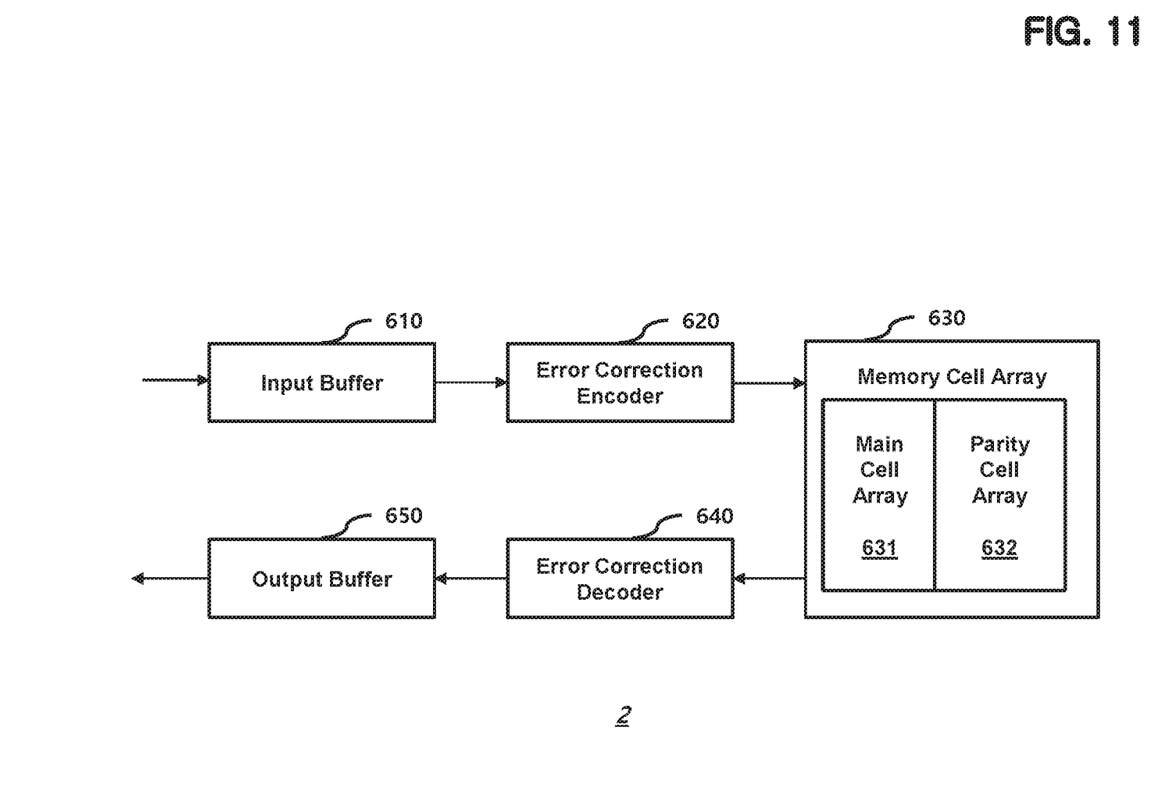
FIG. 11 show a detailed block diagram illustrating a semiconductor device according to an embodiment of the present disclosure.

FIG. 11 is a block diagram illustrating a semiconductor device 2 according to an embodiment of the present disclosure.

The semiconductor device 2 includes an input buffer 610 for receiving data, an error correction encoder 620 for encoding the data output from the input buffer 610 according to an error correction algorithm to output a codeword, a memory cell array 630 for storing a codeword output from the error correction encoder 620, an error correction decoder 640 for decoding a codeword output from a memory cell array 630 according to an error correction algorithm and outputting error corrected data, and an output buffer 650 for buffering and outputting data from the error correction decoder 640.

The memory cell array 630 may store data and parity separately. In this case, the memory cell array 630 may include a main cell array 631 for storing data and a parity cell array 632 for storing parity.

In this embodiment, the error correction algorithm includes a Reed Solomon algorithm, wherein the error correction decoder 640 includes the Reed Solomon decoder 1 of FIG. 3.

The semiconductor device 2 may be implemented in various embodiments such as a semiconductor memory device, a network device, and the like.

FIG. 11 shows representative blocks included in the semiconductor device 2. Therefore, further blocks that are used to transfer data may be added between blocks disclosed in FIG. 11.

The semiconductor device 2 prevents a bottleneck in the decoding process because the error correction decoder 640 may perform the decoding operation at higher speed.

Since the semiconductor device 2 performs the error correction encoding and decoding functions, there is no need for a separate encoding and decoding device outside of the semiconductor device 2. Thereby an area of the system including the semiconductor device 2 and the manufacturing cost thereof may be reduced.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A Reed Solomon decoder comprising:
   a syndrome calculation (SC) circuit configured to calculate a syndrome from a codeword;
   a key equation solver (KES) circuit configured to calculate an error location polynomial and an error evaluation polynomial from the syndrome; and
   a Chien search and error evaluation (C SEE) circuit configured to calculate an error location and an error value from the error location polynomial and the error evaluation polynomial,
   wherein the KES circuit comprises a plurality of sub-KES circuits and each of the plurality of sub-KES circuits, the SC circuit, and the CSEE circuit respectively comprise pipeline stages.

2. The Reed Solomon decoder of claim 1, further comprising:
   a first-in, first-out (FIFO) queue configured to queue the codeword among a plurality of codewords sequentially received; and
   an error correction circuit configured to produce and output error corrected data using an output from the FIFO queue and the error location and the error value.

3. The Reed Solomon decoder of claim 1, wherein each of the plurality of sub-KES circuits comprises a plurality of processing element (PE) circuits connected in series and a control circuit configured to control the plurality of PE circuits.

4. The Reed Solomon decoder of claim 3, wherein a number of the plurality of sub-KES circuits is t (t is a natural number) and a number of the plurality of PE circuits in each of the plurality of sub-KES circuits is 3t+1.

5. The Reed Solomon decoder of claim 3, wherein each of the plurality of PE circuits comprises a first operation circuit configured to perform a first operation and a second operation circuit configured to perform a second operation,
   wherein the control circuit comprises a first control circuit configured to control the first operation circuits of the PE circuits and a second control circuit configured to control the second operation circuits of the PE circuits, and
   wherein the control circuit controls the first operation circuits and the second operation circuits so that the second operation is performed after the first operation is completed.

6. The Reed Solomon decoder of claim 1, wherein the SC circuit comprises a plurality of sub-SC circuits each configured to calculate a syndrome element of the syndrome from the codeword.

7. The Reed Solomon decoder of claim 6, wherein the plurality of sub-SC circuits operates in parallel to each other.

8. The Reed Solomon decoder of claim 1, wherein the CSEE circuit comprise:
   a Chien search (CS) circuit configured to determine the error location from the error location polynomial; and
   an error evaluation (EE) circuit configured to determine the error value from the error evaluation polynomial and the error location.

9. A semiconductor device comprising:
   an error correction encoder configured to output a codeword by encoding data;
   a memory cell array configured to store the codeword output from the error correction encoder; and
   an error correction decoder configured to output error corrected data by decoding a codeword output from the memory cell,
   wherein the error correction decoder comprises:
      a SC circuit configured to calculate a syndrome from a codeword;
      a KES circuit configured to calculate an error location polynomial and an error evaluation polynomial from the syndrome; and
      a CSEE circuit configured to calculate an error location and an error value from the error location polynomial and the error evaluation polynomial,
   wherein the KES circuit comprises a plurality of sub-KES circuit and each of the plurality of sub-KES circuits, the SC circuit, and the CSEE circuit respectively comprise pipeline stages.

10. The semiconductor device of claim 9, further comprising:
    an input buffer configured to output the data to the error correction encoder by buffering input data; and
    an output buffer configured to provide output data by buffering the error corrected data.

11. The semiconductor device of claim 9, wherein the codeword includes a data part and a parity part, and
    wherein the memory cell array comprises a main cell array to store the data part and a parity cell array to store the parity part.

12. The semiconductor device of claim 9, wherein the error correction decoder further comprises a first-in, first-out (FIFO) queue configured to queue the codeword among a plurality of codewords sequentially received; and an error correction circuit configured to produce and output error corrected data using an output from the FIFO queue and the error location and the error value.

13. The semiconductor device of claim 9, wherein each of the plurality of sub-KES circuit comprises a plurality of PE circuits connected in series and a control circuit configured to control the plurality of PE circuits.

14. The semiconductor device of claim 13, wherein a number of the plurality of sub-KES circuits is t (t is a natural number) and a number of the plurality of PE circuits in each of the plurality of sub-KES circuits is 3t+1.

15. The semiconductor device of claim 13, wherein each of the plurality of PE circuits comprises a first operation circuit configured to perform a first operation and a second operation circuit configured to perform a second operation and wherein the control circuit comprises a first control circuit configured to control the first operation circuits of the PE circuits and a second control circuit configured to control the second operation circuits of the PE circuits.

16. The semiconductor device of claim 9, wherein the SC circuit comprises a plurality of sub-SC circuits each configured to calculate a syndrome element of the syndrome from the codeword.

17. The semiconductor device of claim 16, wherein the plurality of sub-SC circuits operates in parallel to each other.

18. The semiconductor device of claim 9, wherein the CSEE circuit comprise:
 a Chien search (CS) circuit configured to determine the error location from the error location polynomial; and
 an error evaluation (EE) circuit configured to determine the error value from the error evaluation polynomial and the error location.

* * * * *